(12) United States Patent
Miyazawa et al.

(10) Patent No.: US 9,595,491 B2
(45) Date of Patent: Mar. 14, 2017

(54) APPARATUS FOR MANUFACTURING SEMICONDUCTOR DEVICE AND THE SEMICONDUCTOR DEVICE

(71) Applicant: FUJI ELECTRIC CO., LTD., Kawasaki-shi (KR)

(72) Inventors: Yosuke Miyazawa, Okaya (JP); Kazunaga Onishi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/849,094

(22) Filed: Sep. 9, 2015

(65) Prior Publication Data

US 2016/0093564 A1    Mar. 31, 2016

(30) Foreign Application Priority Data

Sep. 26, 2014 (JP) ................. 2014-197357

(51) Int. Cl.
| | |
|---|---|
| *H01L 23/498* | (2006.01) |
| *B23K 20/10* | (2006.01) |
| *B23K 37/04* | (2006.01) |
| *H01L 23/492* | (2006.01) |
| *H05K 3/34* | (2006.01) |

(52) U.S. Cl.
CPC ........ *H01L 23/49844* (2013.01); *B23K 20/10* (2013.01); *B23K 37/0408* (2013.01); *H01L 23/492* (2013.01); *B23K 2201/40* (2013.01); *H01L 2924/0002* (2013.01); *H01L 2924/3511* (2013.01); *H05K 3/3421* (2013.01); *H05K 2203/0285* (2013.01); *H05K 2203/167* (2013.01)

(58) Field of Classification Search
CPC .. B23K 1/0016; B23K 20/10; B23K 37/0408; H01L 23/492; H01L 23/49844; H05K 3/341; H05K 2203/04
See application file for complete search history.

(56) References Cited

U.S. PATENT DOCUMENTS

| | | | | |
|---|---|---|---|---|
| 3,328,875 A | * | 7/1967 | Pennings | ............... B23K 20/10 228/111 |
| 3,995,845 A | * | 12/1976 | Scheffer | ................. B23K 20/10 228/180.5 |
| 5,316,204 A | * | 5/1994 | Takehashi | ............ B23K 20/005 228/160 |

(Continued)

FOREIGN PATENT DOCUMENTS

| | | |
|---|---|---|
| JP | H10-296985 A | 11/1998 |
| JP | 2006-128486 A | 5/2006 |

(Continued)

*Primary Examiner* — Allan R Wilson
(74) *Attorney, Agent, or Firm* — Rabin & Berdo, P.C.

(57) ABSTRACT

An apparatus for a manufacturing semiconductor device including a plate member and a joint member. The apparatus includes a plate-type tool having the plate member mounted thereon, a first fixing tool and a second fixing tool having an inclined surface for abutting an upper edge of an end part in a width direction of plate member. The second fixing tool is fixed onto the plate-type tool adjacent to the end part. An ultrasonic horn applies ultrasonic vibration in the width direction of plate member while pressing the joint member toward the plate member.

13 Claims, 13 Drawing Sheets

(56) References Cited

U.S. PATENT DOCUMENTS

| | | | |
|---|---|---|---|
| 6,158,645 A * | 12/2000 | Sakamoto | B23K 20/10 228/1.1 |
| 6,202,915 B1 * | 3/2001 | Sato | B23K 20/10 156/73.1 |
| 6,206,274 B1 * | 3/2001 | Ball | B23K 20/004 228/180.5 |
| 6,290,116 B1 * | 9/2001 | Ball | B23K 20/004 228/180.5 |
| 2002/0089057 A1 * | 7/2002 | Ikegami | H01L 23/49838 257/734 |
| 2006/0091185 A1 | 5/2006 | Matsumura et al. | |

FOREIGN PATENT DOCUMENTS

| | | |
|---|---|---|
| JP | 2007-123937 A | 5/2007 |
| JP | 2013-158858 A | 8/2013 |
| WO | WO-2005/117095 A1 | 12/2005 |

\* cited by examiner

APPARATUS FOR MANUFACTURING SEMICONDUCTOR DEVICE AND THE SEMICONDUCTOR DEVICE

CROSS-REFERENCE TO RELATED APPLICATION

This application is based on, and claims priority to, Japanese Patent Application No. 2014-197357, filed on Sep. 26, 2014, the contents of which are entirely incorporated herein by reference.

BACKGROUND OF THE INVENTION

1. Field of the Invention

The present invention relates to apparatus for manufacturing semiconductor device and the semiconductor device.

2. Description of the Related Art

An example of semiconductor device includes a base plate, an insulating substrate joined to the base plate, a semiconductor element joined to the insulating substrate, and an external terminal joined to the insulating substrate. The insulating substrate consists of an insulator plate laminated on one side thereof with a metal plate and on the other side thereof with a circuit board. The semiconductor element and the external terminal are joined to the circuit board of the insulating substrate.

Soldering has been in most use as joining means for joining an external terminal to a circuit board of insulating substrate electrically and mechanically. In recent years, research and development is advanced on utilizing ultrasonic-joining instead of solder-joining. Ultrasonic joining is a method for directly joining an external terminal to a circuit board via no joint material such as solder, by pressing the external terminal toward the circuit board of insulating substrate while applying ultrasonic vibration thereto. Ultrasonic joining has some advantages that the joining can be performed at the normal temperature and high joining reliability is obtained between the external terminals and the insulating substrate.

The followings are disclosed with respect to conventional ultrasonic-joining apparatus and joining method. Japanese Unexamined Patent Application Publication No. 2006-128486 ("Patent Document 1") discloses ultrasonic-mounting method that a semiconductor chip is applied with ultrasonic vibration and flip-chip connected onto a circuit substrate having electrode terminals. Method of Patent Document 1 indicates a way of pressing down by means of substrate pressing tool. However, the method is not a technology for joining structural members of power semiconductor module and the substrate cannot be quite fixed only by pressing down the substrate, and then it is possible that joining state is not stable.

Also, Japanese Unexamined Patent Application Publication No. 2007-123937 ("Patent Document 2") discloses ultrasonic-joining method and apparatus to hold both sides of joint member between applied member and elastic member and to apply ultrasonic vibration thereto. However, these component members cannot be quite fixed even by holding them by using the elastic member, and then it is possible that joining state is not stable.

Further, WO2005/117095 ("Patent Document 3") discloses ultrasonic-joining tool to suck connection straps for ultrasonic-connecting connection straps with electrodes and terminals of semiconductor chip. However, these component members cannot be quite fixed only by sucking the members, and then it is possible that joining state is not stable.

In addition, Japanese Unexamined Patent Application Publication No. H10-296985 ("Patent Document 4") discloses positioning method to make components sucked into a recess part in nearly hip-roofed shape and to micro-vibrate them in the horizontal direction, when positioning components for component-mounting with adhesive agent. However, it is difficult that the method of Patent Document 4 is entirely applied to ultrasonic-joining of component members composing power semiconductor module.

Further, Japanese Unexamined Patent Application Publication No. 2013-158858 ("Patent Document 5") discloses a tool that spring pins are penetrated through a plurality of through holes for the purpose of positioning of a plurality of plate members. However, if the tool is applied to ultrasonic-joining, the members cannot be quite fixed because of the occurrence of rattling during joining due to clearance for inserting the through holes, and then it is possible that joining state is not stable.

SUMMARY OF THE INVENTION

Thus, the present invention solves the above problems advantageously and an object of the present invention is to provide an apparatus for manufacturing semiconductor device possible to securely fix structural members and to obtain stable joining state in ultrasonic-joining the members for semiconductor device such as power semiconductor module.

An aspect of the present invention indicates an apparatus for manufacturing semiconductor device provided with a plate member and a joint member, which includes a plate-type tool with the plate member thereon, a first fixing tool and a second fixing tool having an inclined surface possible to abut on an upper edge of an end part in the width direction of the plate member and being constituted to be fixed onto the plate-type tool adjacent to the end part in the width direction of the plate member, and an ultrasonic horn possible to apply ultrasonic vibration in the width direction of the plate member while pressing joint member toward the plate member.

A semiconductor device of another aspect of the present invention includes a base plate, an insulating substrate joined to the base plate, a semiconductor element mounted onto the insulating substrate, and an external terminal joined to the insulating substrate by ultrasonic joining. A pressed dent is formed by at least one of the first fixing tool and the second fixing tool in the above-mentioned apparatus for manufacturing semiconductor device at an upper edge of an end part in the width direction of the base plate.

In accordance with an apparatus for manufacturing semiconductor device in the present invention, when ultrasonic-joining structural members of semiconductor device, such apparatus can securely fix the members, and so can obtain stable joining state, and moreover makes it possible to perform high reliability of joining.

DESCRIPTION OF THE PREFERRED EMBODIMENTS

Figure 1:
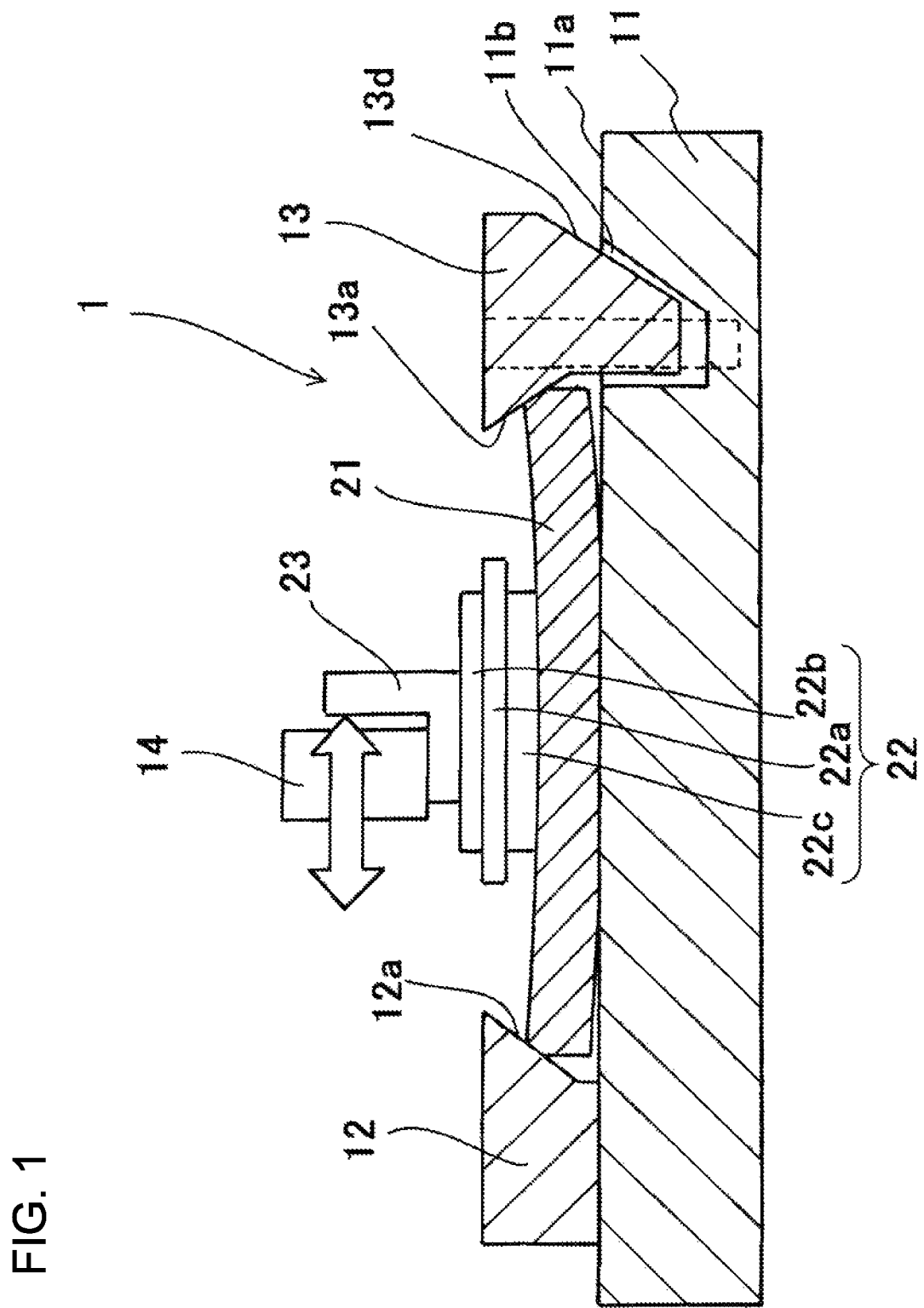
FIG. 1 is a schematic sectional view according to an embodiment of an apparatus for manufacturing semiconductor device of the present invention.

Some embodiments of an apparatus for manufacturing semiconductor device and a semiconductor device manufactured by the manufacturing apparatus concerned will be described specifically with reference to the accompanying drawings below. Additionally in the description below, the word of upper or lower means upper or lower positional relationship shown in the drawings.

(First Embodiment)

FIG. 1 is a schematic sectional view according to an embodiment of an apparatus for manufacturing semiconductor device of the present invention. Apparatus 1 for manufacturing semiconductor device shown in FIG. 1 includes a plate-type tool 11, a first fixing tool 12, a second fixing tool 13, and an ultrasonic horn 14. This manufacturing apparatus 1 is used for fixing plate members of semiconductor device in manufacturing process of semiconductor device and for ultrasonic-joining joint members.

In more detailed example, semiconductor device is a power semiconductor module, plate member is a base plate 21 and joint member is an external terminal 23. The power semiconductor module includes a base plate 21, an insulating substrate 22 fixed by joint material such as solder on a front surface of the base plate 21, and an external terminal 23 joined to the insulating substrate 22. The insulating substrate 22 consists of an insulator plate 22a, a circuit board 22b, and a metal plate 22c. Manufacturing apparatus 1 for semiconductor device of this embodiment directly joins a circuit board 22b with an external terminal 23 by ultrasonic-joining as an embodiment.

Power semiconductor module, which is finally obtained through ultrasonic-joining process by using the manufacturing apparatus 1 of the embodiment, includes a semiconductor chip as semiconductor element joined by joint material such as solder on circuit board 22b, a wiring member electrically connecting electrode of semiconductor chip with circuit board 22b, and a housing for putting therein insulating substrate 22, semiconductor chip and wiring members, in addition to base plate 21, insulating substrate 22 and external terminal 23 shown in FIG. 1. In FIG. 1 and the drawings for using the description below, illustration such as semiconductor chip and wiring member is omitted for making it easy to understand the constitution of the present invention.

Plate-type tool 11 of manufacturing apparatus 1 in the embodiment has a flat front surface 11a and places a base plate 21 on this front surface 11a. A first fixing tool 12 and a second fixing tool 13 are fixed on the plate-type tool 11 adjacent to an end part in the width direction of the base plate 21. By using the first fixing tool 12 and the second fixing tool 13, the base plate 21 is held therebetween and fixed.

The first fixing tool 12 has a nearly trapezoidal sectional shape and an inclined surface 12a abutting on an upper edge of the end part in the width direction of the base plate 21, in the opposite side to the base plate 21. The first fixing tool 12 is fixed onto the front surface 11a of the plate-type tool 11, for example by means of bolts or screws (not illustrated).

Figure 2:
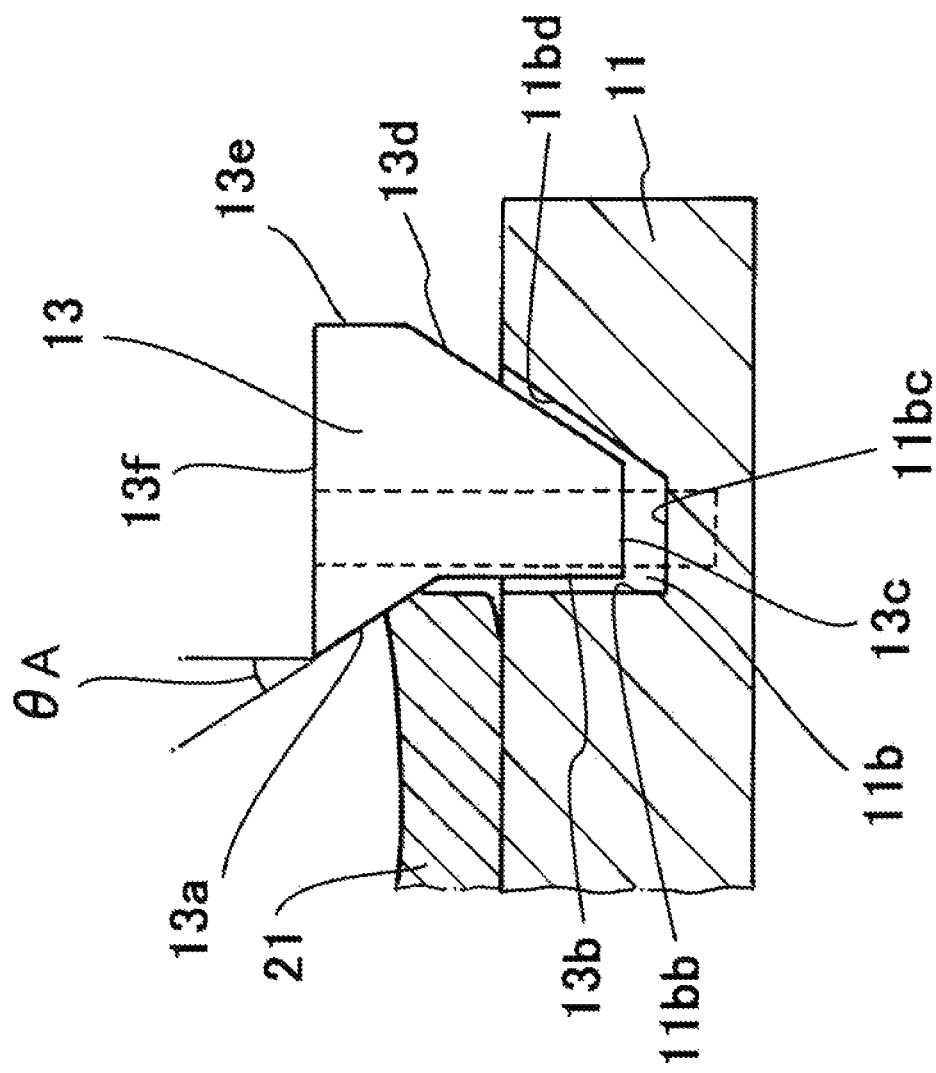
FIG. 2 is a partially enlarged view in the vicinity of a second fixing tool.

FIG. 2 shows a partially enlarged view in the vicinity of the second fixing tool 13. The second fixing tool 13 has an inclined surface 13a abutting on an upper edge of the end part in the width direction of the base plate 21, in the opposite side to the base plate 21. In addition, the second fixing tool 13 forms a polygonal cross-sectional shape having a vertical surface 13b to be connected with a lower end of the inclined surface 13a and to extend to a lower end of the second fixing tool 13, a lower surface 13c to be formed in the lower end, an inclined surface 13d to extend from an end part of the lower surface 13c to the opposite side of the base plate 21, a vertical surface 13e to be connected with this inclined surface 13d, and an upper surface 13f.

The second fixing tool 13 is constituted so that a lower part of the second fixing tool 13 is inserted into a recessed part 11b formed in the plate tool 11 and detachably fixed for example by means of bolts or screws (not illustrated).

The recessed part 11b, which is formed in the plate-type tool 11 for corresponding to a lower shape of the second fixing tool 13, has a vertical surface 11bb corresponding to the vertical surface 13b of the second fixing tool 13, a bottom face 11bc corresponding to the lower surface 13c of the second fixing tool 13, and an inclined surface 11bd corresponding to the inclined surface 13d of the second fixing tool 13. Thus, the lower part of the second fixing tool 13 has a shape detachably fitted into the recessed part 11b of the plate-type tool 11.

An ultrasonic horn 14 transmits ultrasonic vibration from an ultrasonic oscillator (not illustrated), abuts a tip thereof to an external terminal 23, and applies ultrasonic vibration in the same direction as the width direction of the base plate 21 while pressing toward a circuit board 22b. An arrow shows the direction of ultrasonic vibration in FIG. 1. Thus, the external terminal 23 is ultrasonic-joined to the circuit board 22b.

Joining method is described that a circuit board 22b is ultrasonic-joined with an external terminal 23 by using manufacturing apparatus 1 of semiconductor device. First, a base plate 21 is prepared on which an insulating substrate 22 is joined. A plate-type tool 11 is prepared on which a first fixing tool 12 is fixed.

The base plate 21 is placed on a front surface 11a of the plate-type tool 11. At this time, an upper edge of one end in the width direction of the base plate 21 is abutted on an inclined surface 12a of the first fixing tool 12.

Next, a lower part of a second fixing tool 13 is inserted so as to be fitted into a recessed part 11b of the plate-type tool 11, and fixed by means of bolts and screws. At this time, an upper edge of the other end in the width direction of the base plate 21 is abutted on an inclined surface 13a of the second fixing tool 13, pressing force is applied from the inclined surface 13a to the direction of the base plate 21, and consequently the base plate 21 can be securely fixed.

After fixing the base plate 21, the external terminal 23 is ultrasonic-joined with the circuit board 22b by applying ultrasonic vibration in the same direction as the width direction of the base plate 21, while pressing the external terminal 23 toward a predetermined position of the circuit board 22b by means of an ultrasonic horn 14.

In manufacturing apparatus 1 of semiconductor device of the present embodiment, the first fixing tool 12 and the second fixing tool 13 to be arranged so as to hold the base plate 21 therebetween can securely fix the base plate 21 by pressing down the end part in the width direction of the base plate 21 from the diagonal top. Each of the inclined surface 12a of the first fixing tool 12 and the inclined surface 13a of the second fixing tool 13 is formed so as to become inclined at an angle to the plate-type tool 11, and then pressing force to act from the inclined surface 12a and the inclined surface 13a to the base plate 21 functions in the direction to press down the base plate 21 onto the plate-type tool 11. Accordingly, when the external terminal 23 is applied to be joined with ultrasonic vibration through the ultrasonic horn 14 ultrasonic-vibrating in the width direction of the base plate, the base plate 21 can be suppressed to vibrate in the same direction as ultrasonic vibration, and therefore stable joining can be achieved with high reliability.

Further, many base plates 21 have partially or wholly warped shape so as to become convex toward the plate-type tool 11 as shown in FIG. 1. Thus, even if the base plate 21 has warped shape, the first fixing tool 12 and the second fixing tool 13 press down and fix the base plate 21 from the diagonal top, and therefore the base plate 21 can be pressed against the plate-type tool 11 by vertical component of pressing-down force and then can be adhered closely without any warped gap. Accordingly, stable joining can be achieved with high reliability because positioning fluctuation between the base plate 21 and the plate-type tool 11 can be suppressed in ultrasonic joining.

The second fixing tool 13 shown in FIG. 1 has not only the inclined surface 13a on the side opposite to the base plate 21 but also an inclined surface 13d to extend from the lower end the second fixing tool 13 to the opposite side of the base plate 21. By having this inclined surface 13d, when the lower part of the second fixing tool 13 is inserted into the recessed part 11b of the plate-type tool 11, a vertical surface 13b of the second fixing tool 13 is adhered closely on an inclined surface 11bb of the recessed part 11b of the plate-type tool 11, and the inclined surface 13d of the second fixing tool 13 is adhered closely on an inclined surface 11bd of the recessed part 11b. Accordingly, it can be prevented that the second fixing tool 13 fluctuates positioning in the width direction of the base plate 21 within the recessed part 11b, and the base plate 21 can be securely fixed.

In the first fixing tool 12 and the second fixing tool 13, it is desirable to set an angle θA, in the range of 20° to 70°, that each of the inclined surface 12a and 13a abutting on the base plate 21 forms in the vertical direction (that is, in the vertical direction to the front surface 11a of the plate-type tool 11). Angle θA in the second fixing tool 13 is illustrated in FIG. 2. Because θA is in the range of 20° to 70°, pressing force can be generated to both of the width direction and the thickness direction of the base plate 21 when coming into contact with the upper edge of the end part in the width direction of the base plate 21, and the base plate 21 can be securely fixed.

Figure 3:
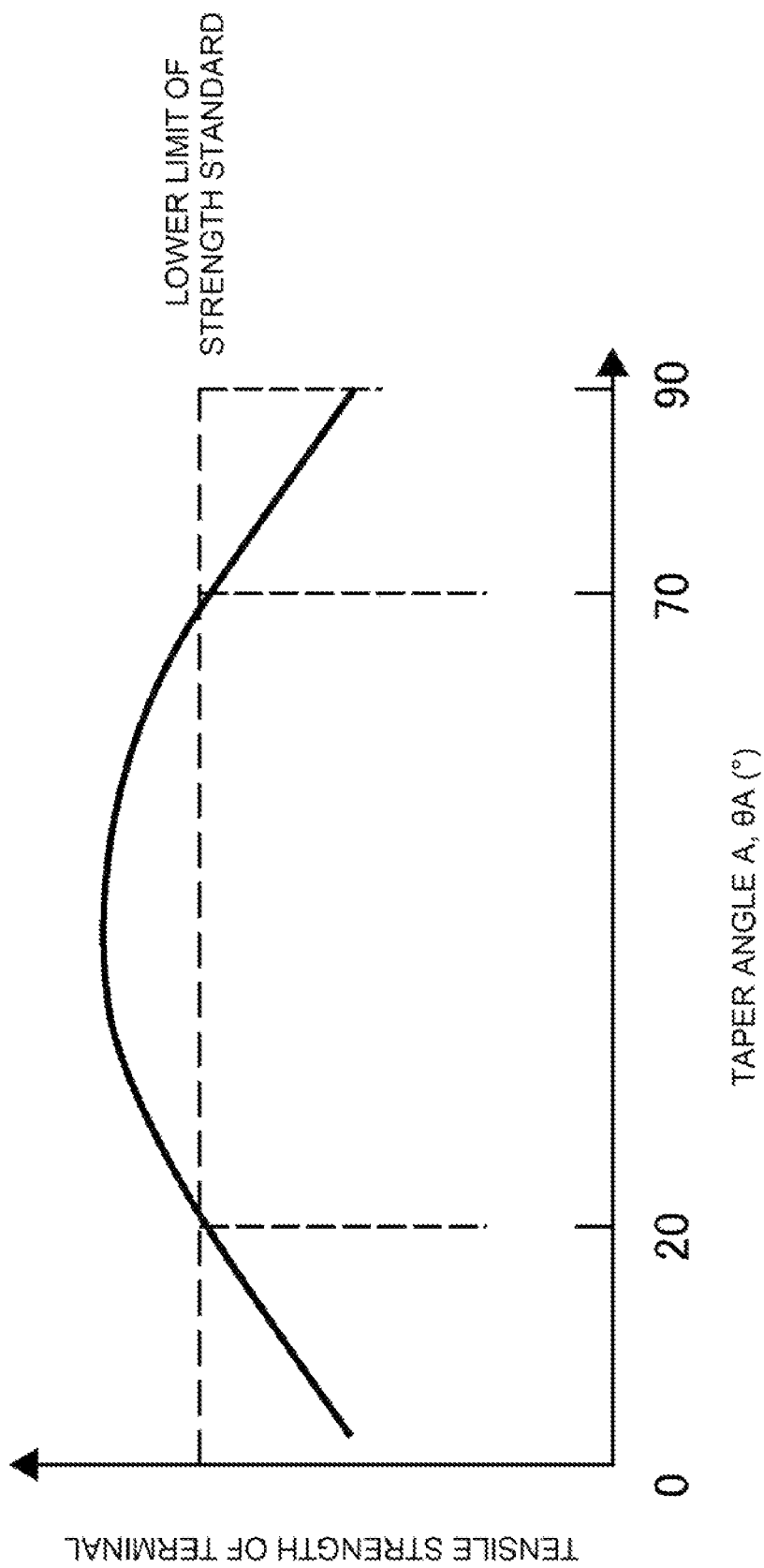
FIG. 3 is a graph showing a relationship between taper angle θA of inclined surface in a second fixing tool and tensile strength of external terminal after ultrasonic joining.

FIG. 3 is a graph showing findings about the relationship between taper angle θA of the inclined surface 13a in the second fixing tool 13 and tensile strength of the external terminal 23 after ultrasonic joining. Good tensile strength is obtained over a range of θA from 20° to 70°. When θA is less than 20°, pressing force in the thickness direction of the base plate 21 becomes smaller, and then the strength decreases because rattling of the base plate 21 increases. When θA is more than 70°, pressing force in the width direction of the base plate 21 becomes smaller, and then the strength decreases because rolling due to ultrasonic vibration of the base plate 21 increases. The most desirable angle of θA is 45°. Additionally, in FIG. 2, angle θA is shown by using the second fixing tool 13; preferable angle θA is the same angle also about the first fixing tool 12, and desirable in the range of 20° to 70°.

Figure 4:
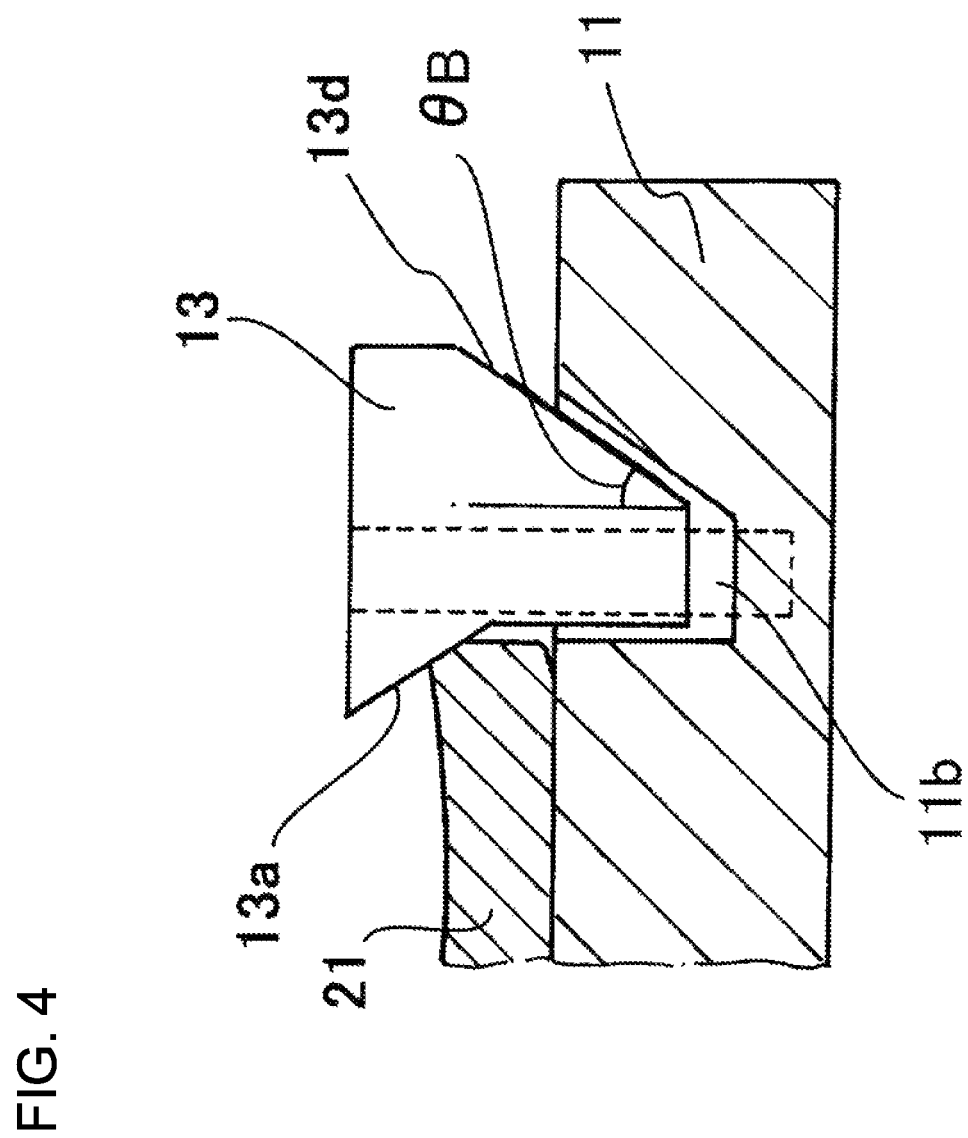
FIG. 4 is a partially enlarged view in the vicinity of a second fixing tool.

In the second fixing tool 13, it is desirable to set angle θB, in the range of 3° to 45°, that the inclined surface 13d of coming into contact with the inclined surface 11bd in the recessed part 11bd of the plate-type tool 11 forms in the vertical direction. Angle θB in the second fixing tool 13 is illustrated in FIG. 4. Because θB is in the range of 3° to 45°, it can be suppressed that the second fixing tool 13 fluctuates positioning within the recessed part 11b of the plate-type tool 11, and therefore the base plate can be securely fixed.

Figure 5:
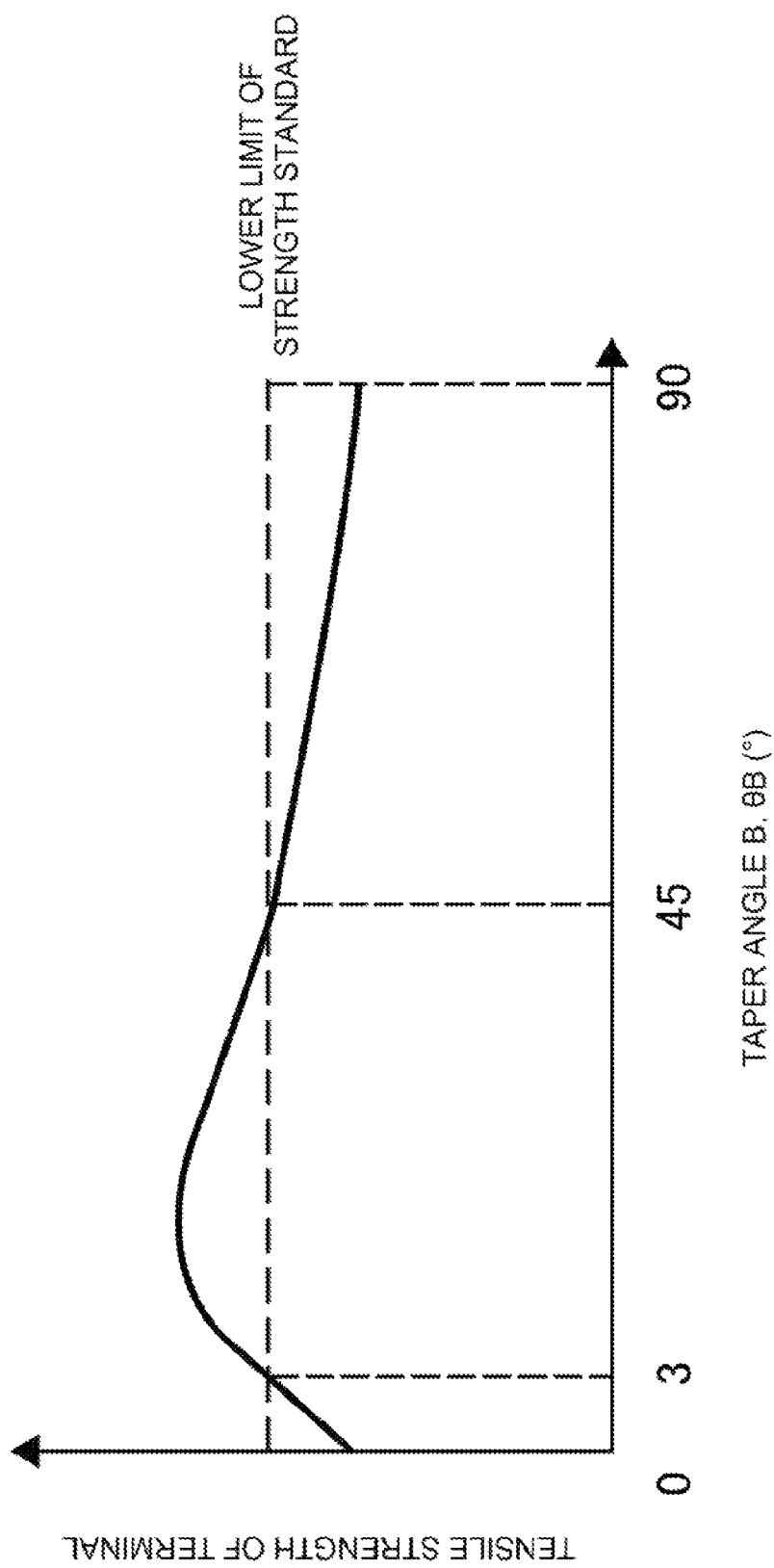
FIG. 5 is a graph showing a relationship between taper angle θB of inclined surface in a second fixing tool and tensile strength of external terminal after ultrasonic joining.

FIG. 5 is a graph showing findings about the relationship between taper angle θB of the inclined surface 13d in the second fixing tool 13 and tensile strength of the external terminal 23 after ultrasonic joining. Good tensile strength is obtained over a range of θB from 3° to 45°. When θB is less than 3°, the second fixing tool 13 comes to be fixed by using only bolts or screws within the recessed part 11b, and the strength decreases because backrush easily generates. When 74 B is over 45°, pressing force of the base plate 21 becomes smaller in the width direction (that is, in the vibrational direction of the ultrasonic horn 14), and then the strength decreases because rolling of the base plate 21 increases.

Figure 6:
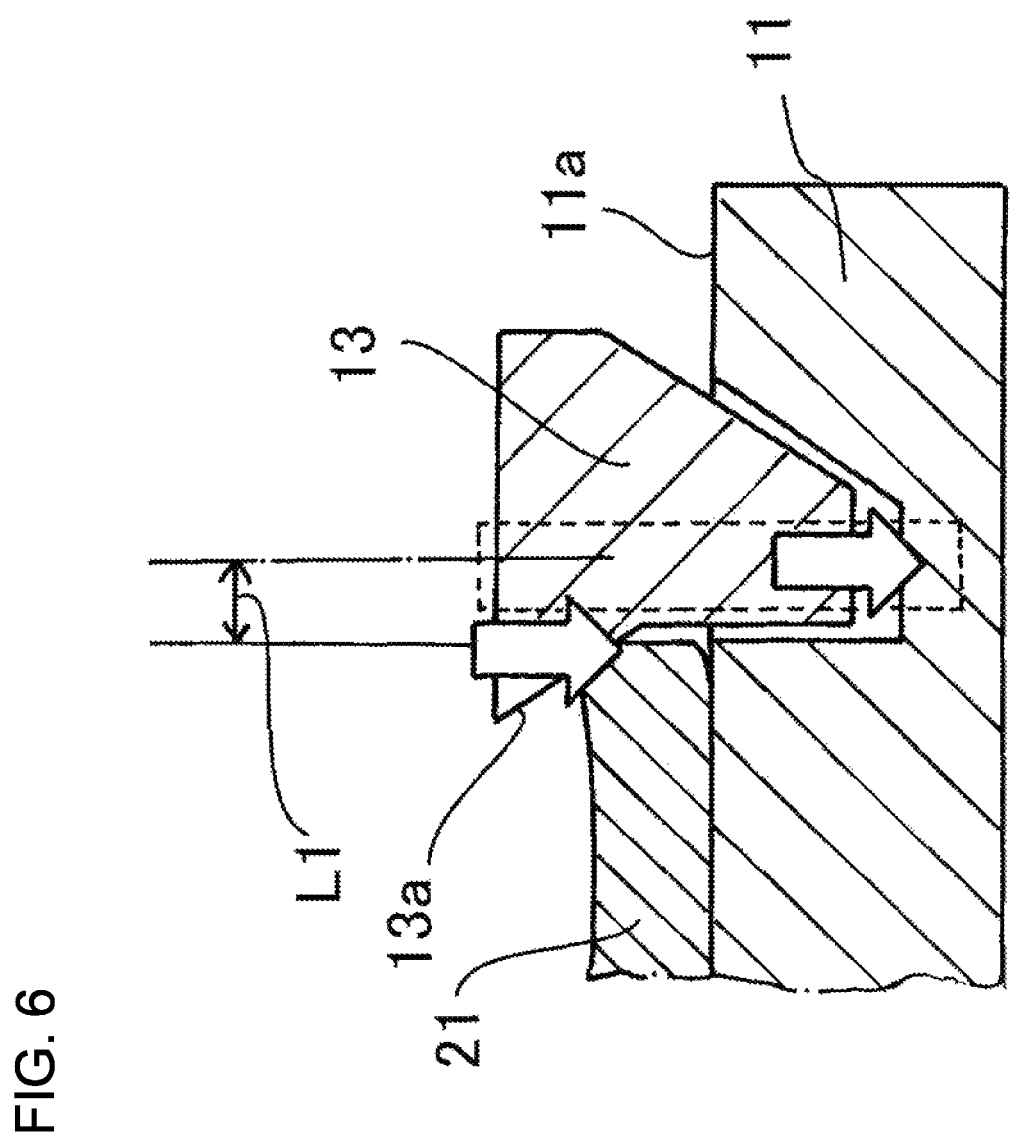
FIG. 6 is a partially enlarged view in the vicinity of a second fixing tool.

FIG. 6 shows a distance L1 in the horizontal direction between mounting position of bolts or screws in the second fixing tool 13 and contact position of the inclined surface 13a with the upper edge of the end part in the width direction of the base plate 21. Here, the horizontal direction means the direction parallel to in-plane direction in the front surface 11a of the plate-type tool 11. Obviously in FIG. 6, the second fixing tool 13 has a shape with the vertical surface 13b connected to the lower end of the inclined surface 13a, and accordingly the distance L1 is short.

Figure 7:
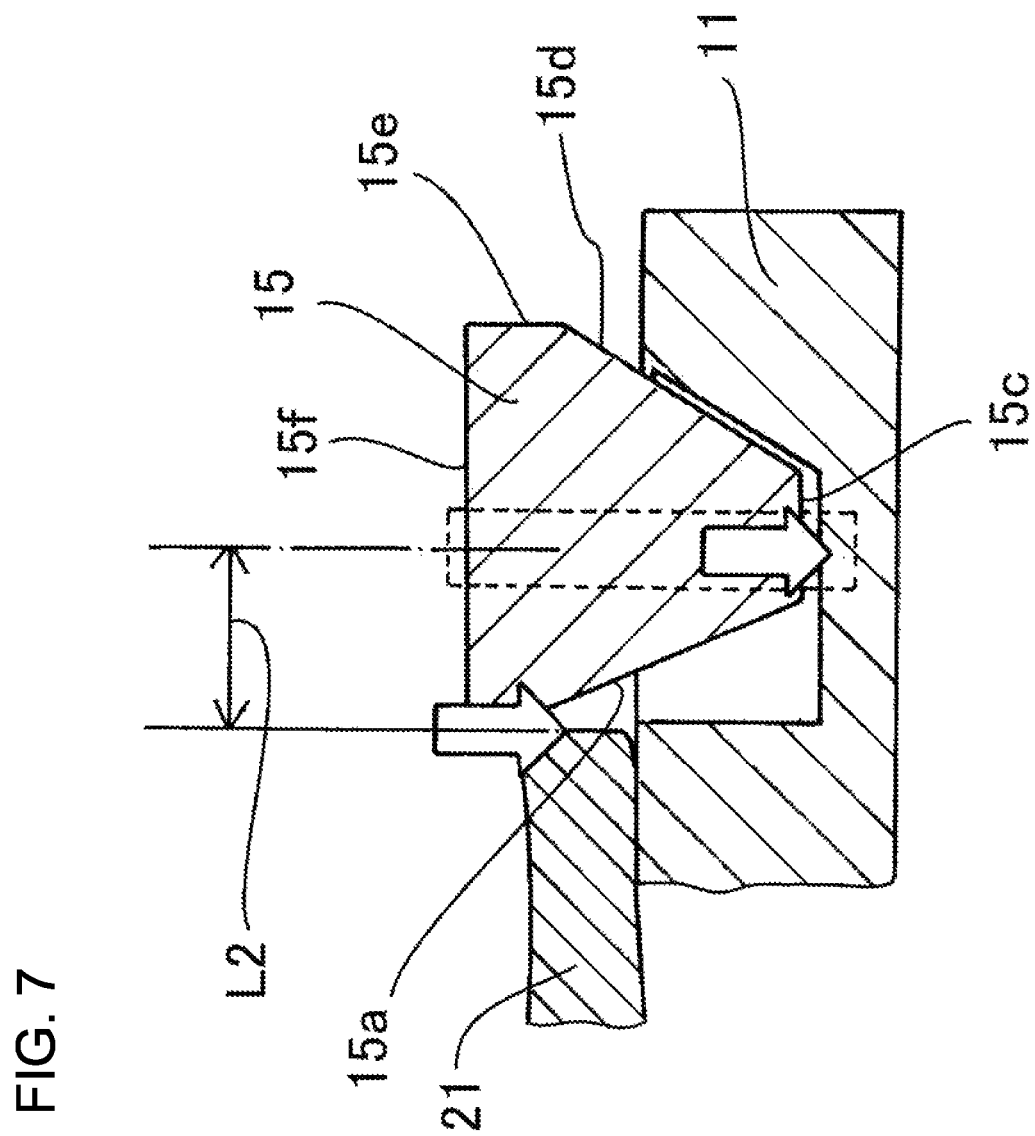
FIG. 7 is a sectional view according to modified example of second fixing tool.

In contrast with the second fixing tool 13 shown in FIG. 6, FIG. 7 shows a sectional view in a modification of the second fixing tool. Fixing tool 15 shown in FIG. 7 has an inclined surface 15a abutting on an upper edge of the end part in the width direction of the base plate 21. In addition, polygonal cross-sectional shape is formed that has a lower surface 15c to be formed in a lower end to be connected with the inclined surface 15a, a inclined surface 15d to extend from the end part of the lower surface 15c to the opposite side of the base plate 21, a vertical surface 15e to be connected with this inclined surface 15d, and an upper surface 15f. The fixing tool 15 has a different shape from the second fixing tool 13 shown FIG. 6, in respect of having no vertical surface similar to vertical surface 13b of the second fixing tool 13. The fixing tool 15 shown in FIG. 7 has the same inclined surface 15a and inclined surface 15d that the second fixing tool 13 has, and therefore has the same effect that the second fixing tool 13 has. Indeed, the fixing tool 15 has longer distance than the second fixing tool 13 shown FIG. 6, in respect of a distance L2 in the horizontal direction between mounting position of bolts or screws and contact position of inclined surface 15a with the upper edge of the end part in the width direction of the base plate 21. Thus, the force pressing the base plate 21 coming from axial force of bolts or screws is smaller than the second fixing tool 13. That is, the second fixing tool 13 shown in FIG. 6 has larger force for pressing the base plate 21 than the fixing tool 15 shown in FIG. 7, and therefore provides preferable shape.

Figure 8:
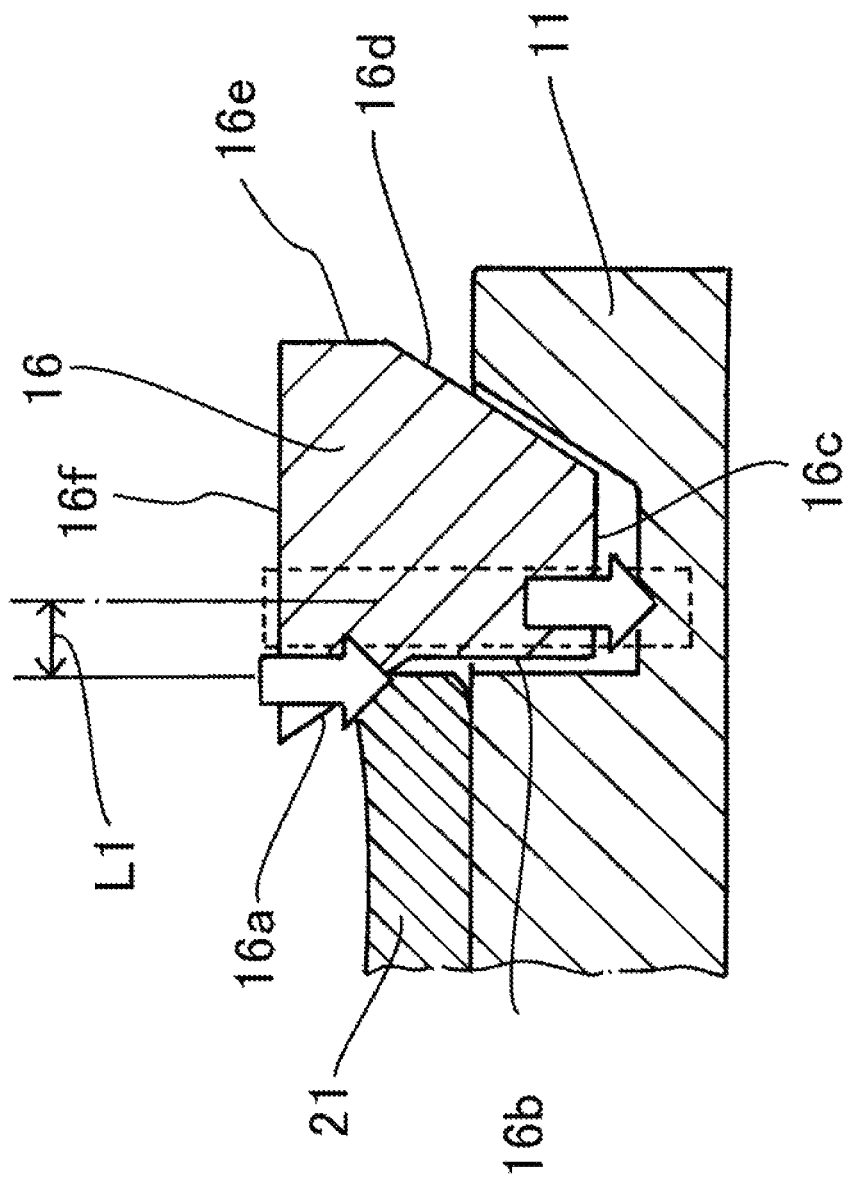
FIG. 8 is a sectional view according to modified example of second fixing tool.

FIG. 8 shows a sectional view according to a modification of the second fixing tool 13. Fixing tool 16 shown in FIG. 8 has an inclined surface 16a abutting on an upper edge of the end part in the width direction of the base plate 21, in the opposite side of the base plate 21. In addition, polygonal cross-sectional shape is formed that has a vertical surface 16b to be connected with a lower end of the inclined surface 16a and to extend to a lower end of the fixing tool 16, a lower surface 16c to be formed in the lower end, an inclined surface 16d to extend from the end part of the lower surface 16c to the opposite side of the base plate 21, a vertical surface 16e to be connected with this inclined surface 16d, and an upper surface 16f. The fixing tool 16 has broad lower surface 16c compared with the second fixing tool 13 shown in FIG. 6. Since broad lower surface 16c suppresses the force for pivoting on apart fixed by bolts or screws in the fixing tool 16 as compared with the second fixing tool 13, the base plate 21 can be fixed more securely.

Figure 9:
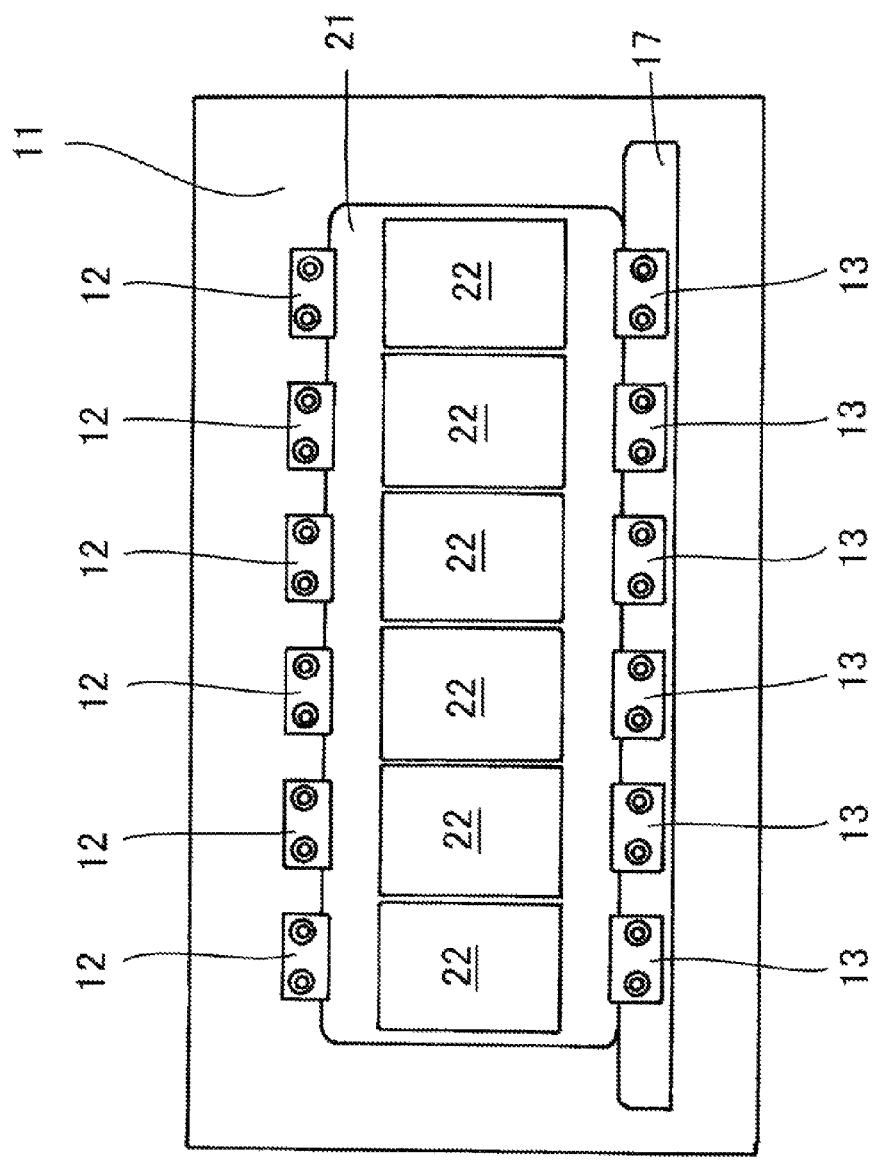
FIG. 9 is a plane view according to an embodiment of an apparatus for manufacturing semiconductor device.

FIG. 9 shows a schematic plane view according to an embodiment of apparatus for manufacturing semiconductor device of the invention. In FIG. 9, the same symbols are assigned for the same members as FIG. 1, and duplicated descriptions are omitted below. Further, in order to make understanding of the invention easy, illustrations are omitted for external terminal 23 and ultrasonic horn 14.

In the embodiment shown in FIG. 9, several first fixing tools 12 and second fixing tools 13 are located at equal intervals respectively along the longitudinal direction of the base plate 21. Second fixing tools 13 are mounted on a fixing plate 17 to be formed with recessed part similar to recessed part 11b of plate-type tool 11 in FIG. 1, and fixed to the plate-type tool 11 through the fixing plate 17 by bolts or screws. It is optional to choose the number of first fixing tools 12 and second fixing tools 13 and the length along longitudinal direction (longitudinal length) of the base plate 21. For example, some configuration may make at least one longitudinal length of first fixing tools 12 and second fixing tools 13 nearly equal to longitudinal length of the base plate 21.

The embodiments shown in FIG. 1 and FIG. 9 use the first fixing tool 12 and the second fixing tool 13 that have different sectional shapes. The second fixing tool 13 can be used instead of the first fixing tool 12 in FIG. 1. In other words, a configuration of fixing tools may arrange the second fixing tools 13 at each end in the width direction of the base plate 21 to fix the base plate 21.

(Second Embodiment)

Figure 10:
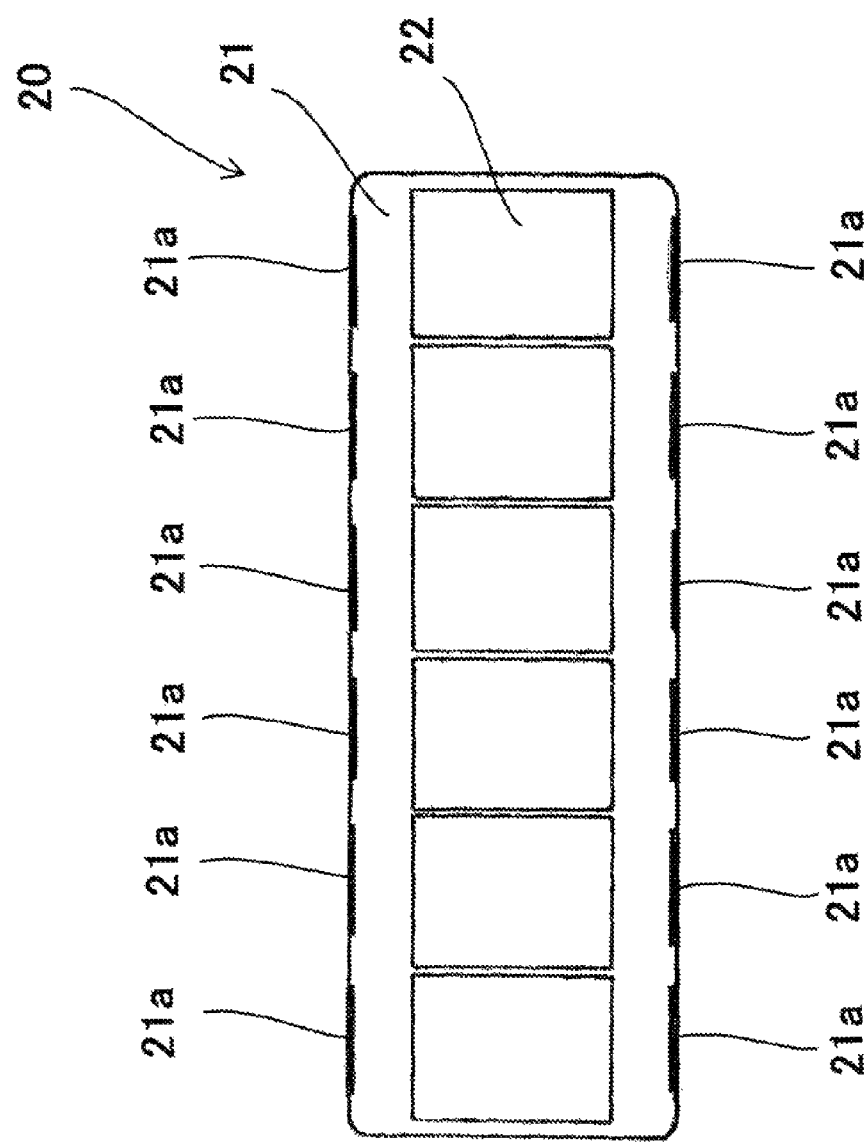
FIG. 10 is a plane view of semiconductor device through ultrasonic-joining process.

FIG. 10 shows a semiconductor device 20 through ultrasonic-joining process by means of manufacturing apparatus of the embodiment shown in FIG. 1 and FIG. 9 by using only base plate 21 and insulating substrate 22 of main component members. In the semiconductor device 20 assembled through ultrasonic-joining process by means of manufacturing apparatus of the embodiment shown in FIG. 1 and FIG. 9, pressed dents 21a which are generated at the time of being abutted, pressed and fixed on an inclined surface 12a of first fixing tool 12 and an inclined surface 13a of second fixing tool 13, are formed on upper edges of both end parts in the width direction of the base plate 21. The pressed dents 21a come out as rounded edges and are clearly distinguishable from edges without pressed dent although the dent area is small.

(Third Embodiment)

Figure 11:
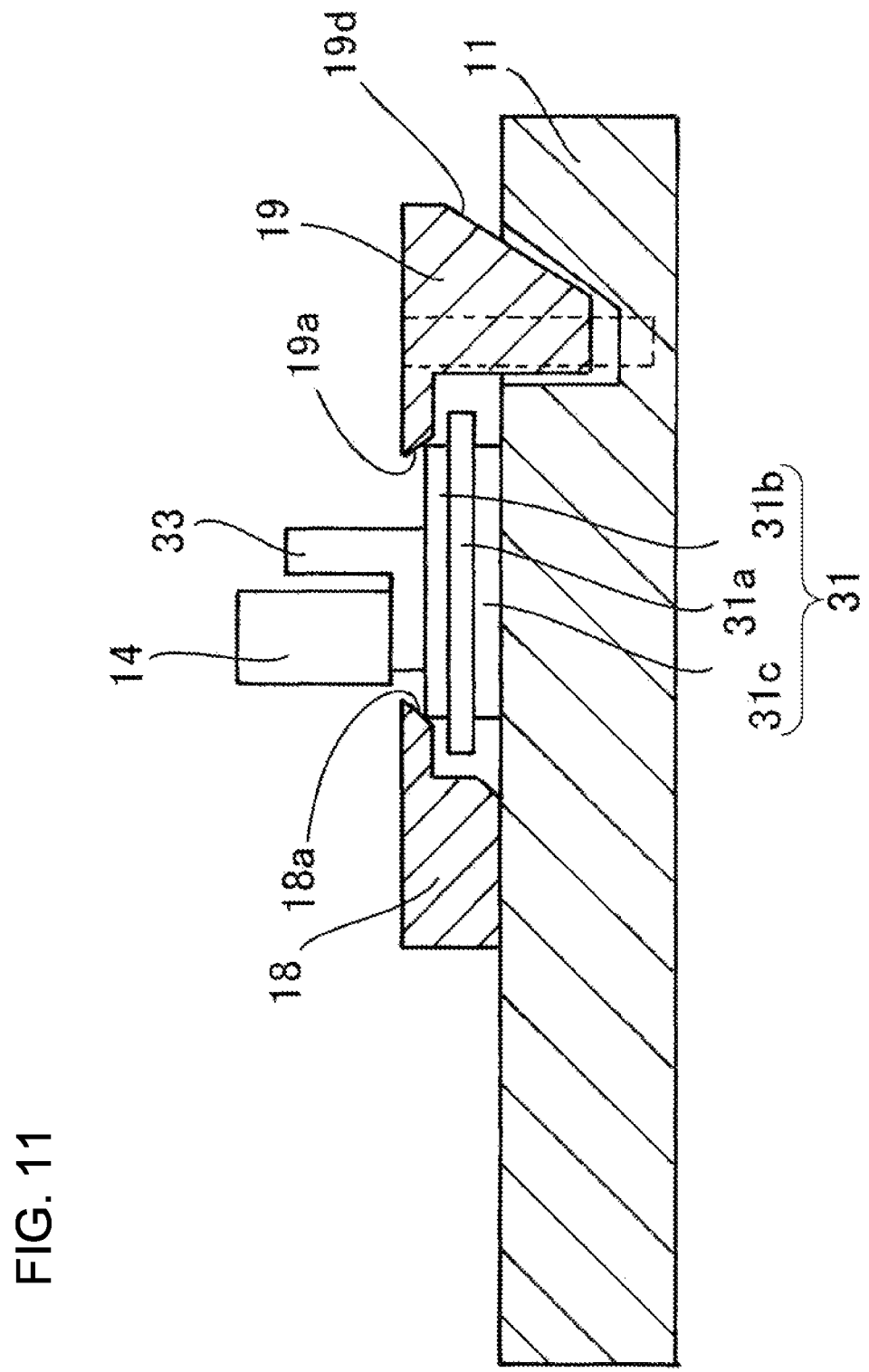
FIG. 11 is a sectional view of an apparatus for manufacturing semiconductor device according to another embodiment.

FIG. 11 shows an apparatus for manufacturing semiconductor device according to another embodiment. In manufacturing apparatus 2 shown in FIG. 11, a semiconductor device to be ultrasonic-joined is different from semiconductor device mentioned above, and specifically, has no base plate. In addition, the semiconductor device is provided with a substrate 31 laminating a circuit board 31b and a metal plate 31c which consist of thick copper plates on both surfaces of insulator plate 31a. The manufacturing apparatus 2 according to this embodiment, which is preferable to ultrasonic-join an external terminal 33 of pin shape with tip formed to L shape on this circuit board 31b, includes a plate-type tool 11, a first fixing tool 18 and a second fixing tool 19, and an ultrasonic horn 14. The first fixing tool 18 and the second fixing tool 19 have inclined surfaces 18a and 19a in order to fix the substrate 31 concerned, and are cut off at an area possible to come into contact with the insulator plate 31a. The rest of the above tools have the same shape as the first fixing tool 12 and the second fixing tool 13 described by using FIG. 1. The apparatus for manufacturing semiconductor device according to the embodiment shown in FIG. 11 includes the inclined surfaces 18a, 19a and 19d, and therefore has the same effect as the apparatus for manufacturing semiconductor device described by using FIG. 1. Further, in semiconductor device through ultrasonic-joining process by means of manufacturing apparatus of the embodiment shown in FIG. 11, pressed dents similar to FIG. 10 are formed on upper edges of both end parts in the width direction of the circuit board 31b.

COMPARATIVE EXAMPLE

Figure 12:
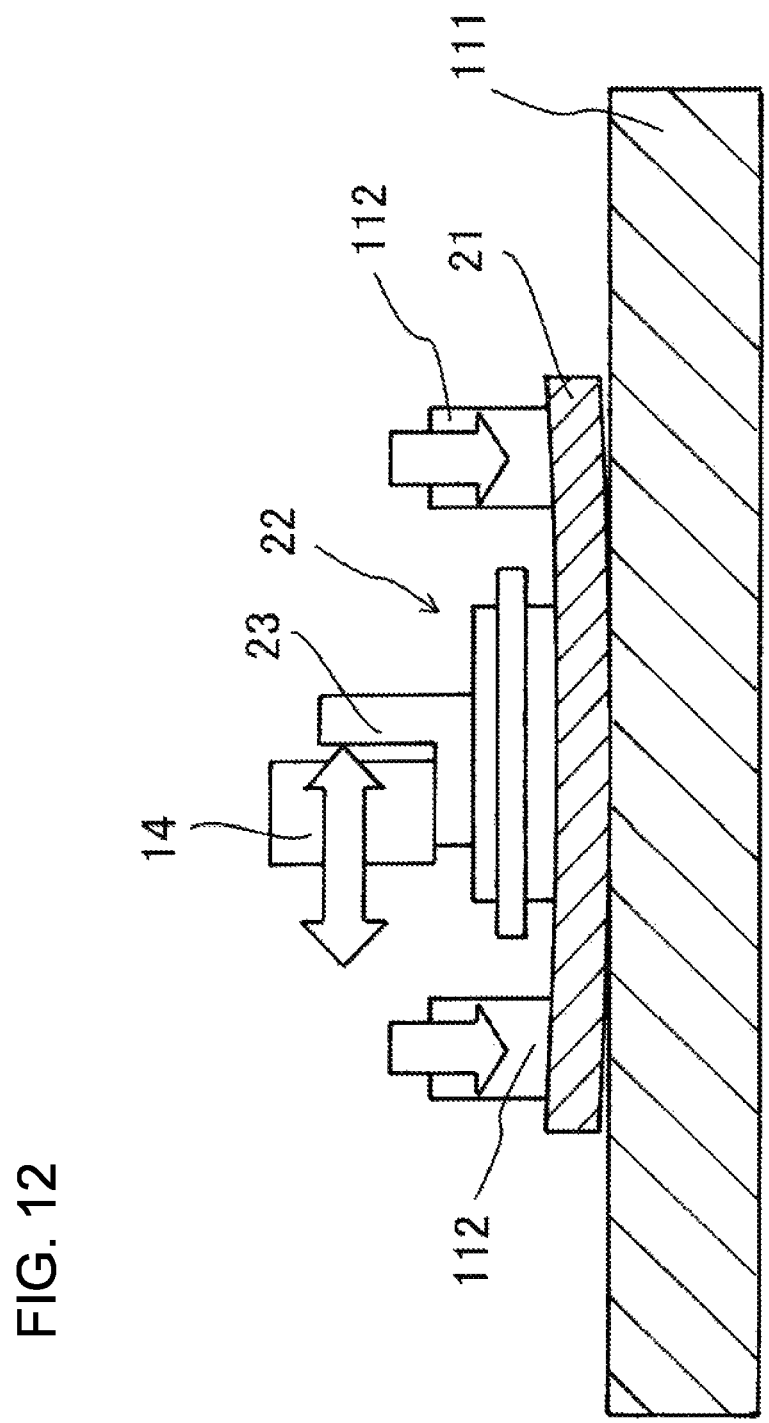
FIG. 12 is a sectional view of an apparatus for manufacturing semiconductor device according to comparative example.
Figure 13:
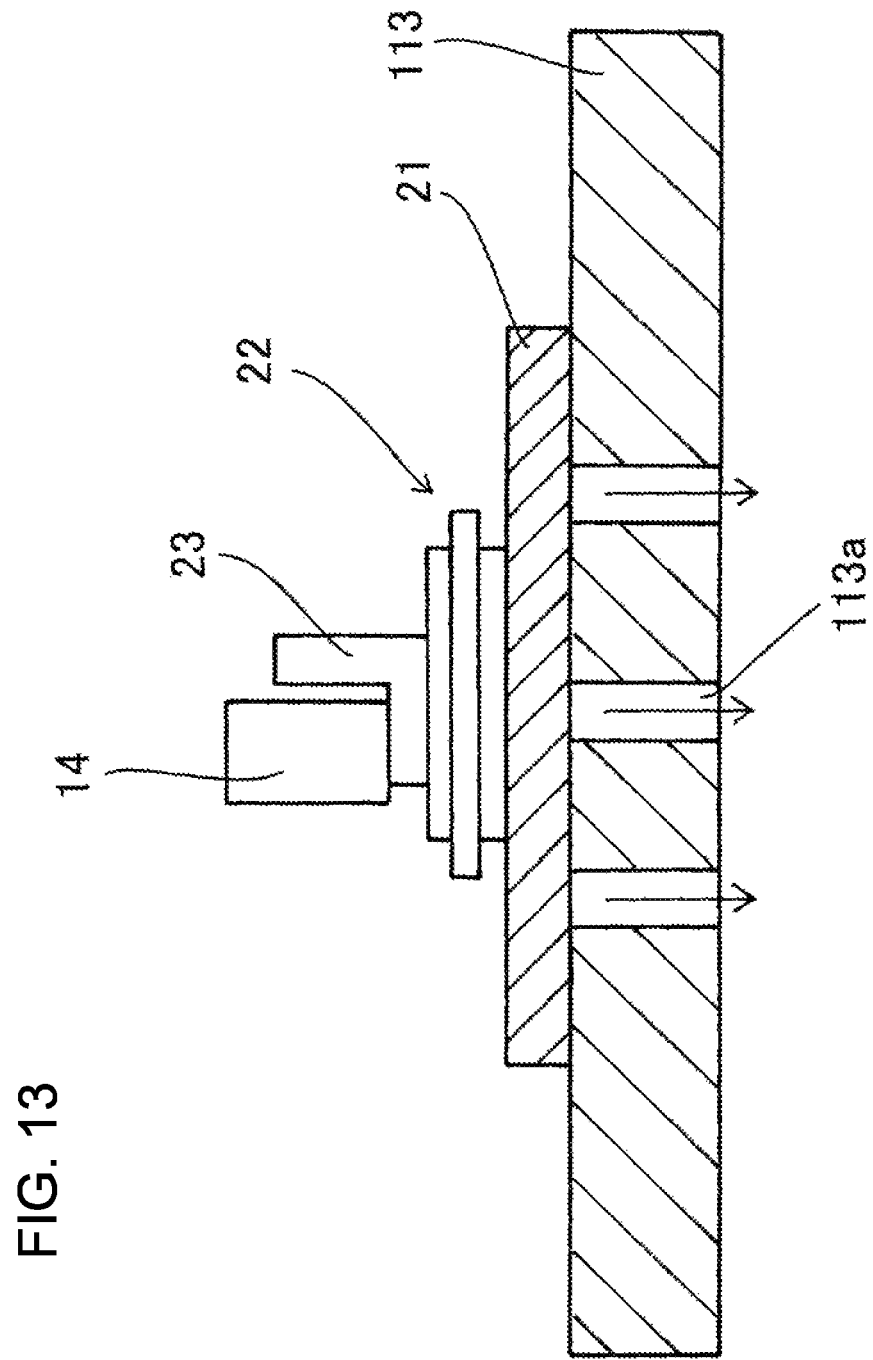
FIG. 13 is a sectional view of an apparatus for manufacturing semiconductor device according to comparative example.

FIG. 12 and FIG. 13 show sectional views of apparatus for manufacturing semiconductor device in comparative examples. FIG. 12 is a comparative example that an end part in the width direction of a base plate 21 on a tool 111 is pressed to the thickness direction and fixed by tool 112 from the top. FIG. 13 is a comparative example that a base plate 21 on a tool 113 is sucked and fixed by the tool 113 having air-vent holes 113a. In comparison with these comparative examples, each embodiment takes excellent effect that base plate 21 can be fixed more securely.

Thus, the apparatus for manufacturing semiconductor device and the semiconductor device according to the present invention have been described specifically by using drawings and embodiments, however the present invention is not limited to description of embodiments and drawings, and many modifications are possible within the scope not to deviate from subject matter of the invention.

| EXPLANATION OF REFERENCE NUMERALS | |
|---|---|
| 1, 2 | apparatus for manufacturing semiconductor device |
| 11 | plate-type tool |
| 12, 18 | first fixing tool |
| 13, 19 | second fixing tool |
| 14 | ultrasonic horn |
| 21 | base plate (plate member) |
| 23 | external terminal (joint member) |

What is claimed is:

1. An apparatus for manufacturing a semiconductor device including a plate member and a joint member, the plate member having a first end part which is an end of the plate member in a width direction of the plate member, the apparatus comprising:
 a plate-type tool for having the plate member to be mounted thereon; and a
 a plurality of fixing tools including
  a first fixing tool, and
  a second fixing tool having an inclined surface for being in direct contact with an upper edge of the first end part of the plate member, the second fixing tool configured to be fixed onto the plate-type tool at a position adjacent to the first end part; and
 an ultrasonic horn for applying an ultrasonic vibration in the width direction of the plate member while pressing the joint member toward the plate member.

2. The apparatus for manufacturing a semiconductor device according to claim 1, wherein the second fixing tool has another inclined surface extending from a lower end of the second fixing tool to a side of the second fixing tool opposite to the plate member.

3. The apparatus for manufacturing a semiconductor device according to claim 1, wherein an angle formed by the inclined surface is 20° to 70° against a vertical direction.

4. The apparatus for manufacturing a semiconductor device according to claim 2, wherein an angle formed by the another inclined surface is 3° to 45° against a vertical direction.

5. The apparatus for manufacturing a semiconductor device according to claim 1, wherein the second fixing tool further has a vertical surface connected to a lower end of the inclined surface.

6. The apparatus for manufacturing a semiconductor device according to claim 1, wherein the first fixing tool has an inclined surface for abutting an upper edge of a second end part of the plate member, the second end part being opposite the first end part in the width direction.

7. The apparatus for manufacturing a semiconductor device according to claim 6, wherein the first fixing tool has a vertical surface connected to a lower end of the inclined surface of the first fixing tool.

8. The apparatus for manufacturing a semiconductor device according to claim 1,
 wherein the plate member is a base plate,
 further wherein the joint member is an external terminal, and
 the semiconductor device further comprising an insulating substrate joined on the base plate,
 further wherein the external terminal is ultrasonically-joined to the insulating substrate by the ultrasonic vibration.

9. The apparatus for manufacturing a semiconductor device according to claim 1, wherein the plate member is a substrate including a circuit board, an insulating plate and a metal plate, the circuit board and the metal plate are joined on two opposite sides of the insulating plate,
 further wherein the joint member is an external terminal, and
 further wherein the circuit board is ultrasonically-joined with the external terminal.

10. The apparatus for manufacturing a semiconductor device according to claim 1, wherein the inclined surface is a first inclined surface, and the second fixing tool has a second inclined surface opposite the first inclined surface and extending from a lower end of the second fixing tool to a side of the second fixing tool opposite to the plate member.

11. The apparatus for manufacturing a semiconductor device according to claim 1, wherein an angle formed by the inclined surface is 20° to 70° with respect to a surface of the first end part.

12. The apparatus for manufacturing a semiconductor device according to claim 1, wherein the inclined surface is in direct contact with the upper edge of the first end part of the plate member.

13. An apparatus for manufacturing a semiconductor device including a plate member and a joint member, the apparatus comprising:
 a plate-type tool for having the plate member to be mounted thereon;
 a fixing tool having an inclined surface for being in direct contact with an upper portion of the plate member; and
 an ultrasonic horn for applying an ultrasonic vibration in a width direction of the plate member while pressing the joint member toward the plate member.

* * * * *